(12) United States Patent
Ausserlechner

(10) Patent No.: US 9,000,763 B2
(45) Date of Patent: Apr. 7, 2015

(54) 3-D MAGNETIC SENSOR

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 791 days.

(21) Appl. No.: 13/036,194

(22) Filed: Feb. 28, 2011

(65) Prior Publication Data

US 2012/0217960 A1 Aug. 30, 2012

(51) Int. Cl.
| | | |
|---|---|---|
| G01R 33/09 | (2006.01) |
| G01R 35/00 | (2006.01) |
| G01B 7/30 | (2006.01) |
| H01L 43/06 | (2006.01) |
| G01R 33/02 | (2006.01) |
| H01L 43/08 | (2006.01) |

(52) U.S. Cl.
CPC ............ *H01L 43/06* (2013.01); *G01R 33/0206* (2013.01); *H01L 43/08* (2013.01)

(58) Field of Classification Search
USPC ......................................................... 324/252
See application file for complete search history.

(56) References Cited

U.S. PATENT DOCUMENTS

| | | | |
|---|---|---|---|
| 4,188,605 A * | 2/1980 | Stout ............................ 338/32 H |
| 5,184,069 A * | 2/1993 | Adler et al. ............... 324/207.22 |
| 6,198,276 B1 | 3/2001 | Konno |
| 6,545,462 B2 | 4/2003 | Schott et al. |
| 6,759,843 B2 * | 7/2004 | Furlong ...................... 324/207.2 |
| 7,727,793 B2 | 6/2010 | Shirasaka et al. |
| 8,058,870 B2 * | 11/2011 | Sterling ......................... 324/252 |
| 8,080,993 B2 * | 12/2011 | Theuss et al. .................. 324/251 |
| 8,283,184 B2 | 10/2012 | Ruehrig |
| 2001/0013777 A1 | 8/2001 | Kato et al. |
| 2002/0021124 A1 | 2/2002 | Schott et al. |
| 2003/0231098 A1 * | 12/2003 | Wan ............................. 338/32 H |
| 2004/0165319 A1 * | 8/2004 | Wan et al. ................... 360/324.1 |
| 2006/0103381 A1 * | 5/2006 | Schmollngruber et al. .. 324/252 |
| 2006/0164204 A1 * | 7/2006 | Nishiwaki et al. ............ 338/200 |
| 2008/0218159 A1 * | 9/2008 | Hinz et al. ................ 324/207.21 |
| 2008/0316654 A1 * | 12/2008 | Aiso ............................. 360/324 |
| 2009/0295381 A1 * | 12/2009 | Theuss et al. ................. 324/252 |

(Continued)

FOREIGN PATENT DOCUMENTS

EP 1182461 A2 2/2002

OTHER PUBLICATIONS

Office Action Dated Jan. 6, 2014 Chinese Patent Application No. 201210047251.6.

*Primary Examiner* — Bot Ledynh
(74) *Attorney, Agent, or Firm* — Eschweiler & Associates, LLC

(57) ABSTRACT

One embodiment of the present invention relates to a magnetic field sensor comprising a squat soft-magnetic body disposed on a surface of a substrate comprising a magnetic sensor array having a plurality of spatially diverse magnetic sensor elements disposed in a predetermined configuration. In the presence of an external magnetic field the squat soft-magnetic body becomes magnetized to generate a reactionary magnetic field. The plurality of magnetic sensor elements are respectively configured to measure a magnetic field value of a superposition of the external magnetic field and the reactionary magnetic field along a first axis (e.g., a z-axis), resulting in a plurality of spatially diverse measurements of the magnetic field component along the first axis. The plurality of spatially diverse measurements may be used to compute magnetic field components of the external magnetic field along a plurality of axes (e.g., x-axis, y-axis, and z-axis).

19 Claims, 11 Drawing Sheets

(56) References Cited

U.S. PATENT DOCUMENTS

| | | |
|---|---|---|
| 2010/0072992 A1 | 3/2010 | Bauer |
| 2012/0025808 A1* | 2/2012 | Granig et al. ............... 324/202 |
| 2012/0268113 A1 | 10/2012 | Sato et al. |
| 2012/0272514 A1* | 11/2012 | Naito et al. ............... 29/602.1 |

* cited by examiner

3-D MAGNETIC SENSOR

BACKGROUND OF THE INVENTION

Magnetic field sensor devices are widely used in sensor applications for contactless sensing of magnetic fields in many automotive and industrial applications. For example, in automotive applications a Hall effect device may be used to measure wheel speed in an automatic braking system (ABS) speed sensor, by measuring the speed of magnetic domains embedded in the wheel. In such an example, if a magnet approaches a stationary Hall effect device then the Hall effect device will measure an increase in the magnetic field. The frequency at which the magnetic field increase is measured allows for the speed of the wheel to be determined.

Typically, magnetic field sensor devices are configured to measure the magnetic field components along a single axis. For example, a lateral Hall plate comprised within a semiconductor die may be configured to measure a magnetic field component along an axis perpendicular to the surface of the semiconductor die. Alternatively, a vertical Hall plate comprised within a semiconductor die may be configured to measure a magnetic field component along an axis parallel to the surface of the semiconductor die. Because magnetic field sensor devices are only able to measure the magnetic field components along a single axis (e.g., an in-plane axis parallel to a plane or an out-of-plane axis normal to the plane), measurement of an out-of-plane angle is difficult.

Often measurement of an out-of-plane angle is done using a combination of different types of magnetic field sensor devices configured to respectively measure in-plane field components and out-of plane field components. By decomposing a magnetic field into one component perpendicular to a surface and another component parallel to the surface, an out-of-plane angle can be calculated as the angle between the two components.

For example, FIG. 1 illustrates an exemplary prior art magnetic field sensor 100 configured to measure an out-of-plane angle θ of a magnetic field $\vec{B}$. The magnetic field sensor 100 comprises a semiconductor die 102, comprising a lateral magnetic field sensor 104 (e.g., an ordinary Hall effect device) and a vertical magnetic field sensor 106 (e.g., a vertical Hall effect device). The lateral magnetic field sensor 104 is configured to measure a vertical magnetic field component 108 perpendicular to the horizontal "top" surface of the semiconductor die 102. The vertical magnetic field sensor 106 is configured to measure a horizontal magnetic field component 110 parallel to the horizontal "top" surface of the semiconductor die 102.

A processing unit may be configured to receive the measured vertical magnetic field component 108 and horizontal magnetic field component 110, and based thereupon to compute magnetic field components along a plurality of directions (e.g., along the x, y, and z axis). However, the resulting computed magnetic field components are sensitive to the tolerances of both types of sensors and therefore is limited by the tolerances of the less accurate of the two sensor types.

DETAILED DESCRIPTION OF THE INVENTION

Figure 1:
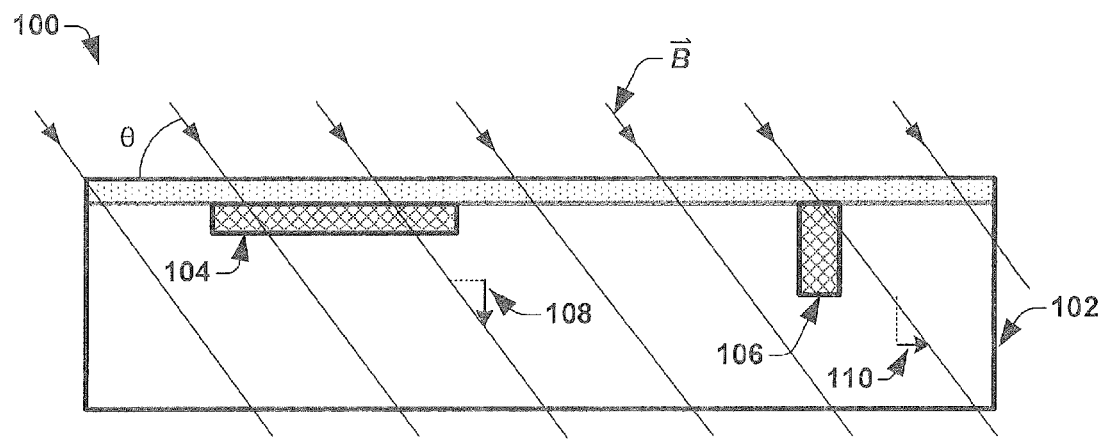
FIG. 1 illustrates an exemplary prior art magnetic field sensor configured to measure an out-of-plane angle of a magnetic field.

The present invention will now be described with reference to the attached drawing figures, wherein like reference numerals are used to refer to like elements throughout, and wherein the illustrated structures and devices are not necessarily drawn to scale.

Some aspects of the present disclosure provide for a magnetic field sensor configured to determine the components of a magnetic field having a non-orthogonal out-of-plane angle. In one embodiment, the method and apparatus comprise a squat soft-magnetic body attached to a surface of a substrate (e.g., directly or via one or more interstitial layers) comprising a magnetic sensor array having a plurality of spatially diverse magnetic sensor elements disposed in a predetermined configuration. In the presence of an external magnetic field the squat soft-magnetic body becomes magnetized to generate a reactionary magnetic field that varies as a function of position within or on a surface of the substrate. The plurality of magnetic sensor elements are respectively configured to measure a magnetic field value of a superposition of the external magnetic field and the reactionary magnetic field along a first axis (e.g., a z-axis), resulting in a plurality of spatially diverse measurements of the magnetic field component along the first axis. The plurality of spatially diverse measurements may be processed to compute magnetic field components of the external magnetic field along a plurality of axes (e.g., x-axis, y-axis, and z-axis).

Figure 2:
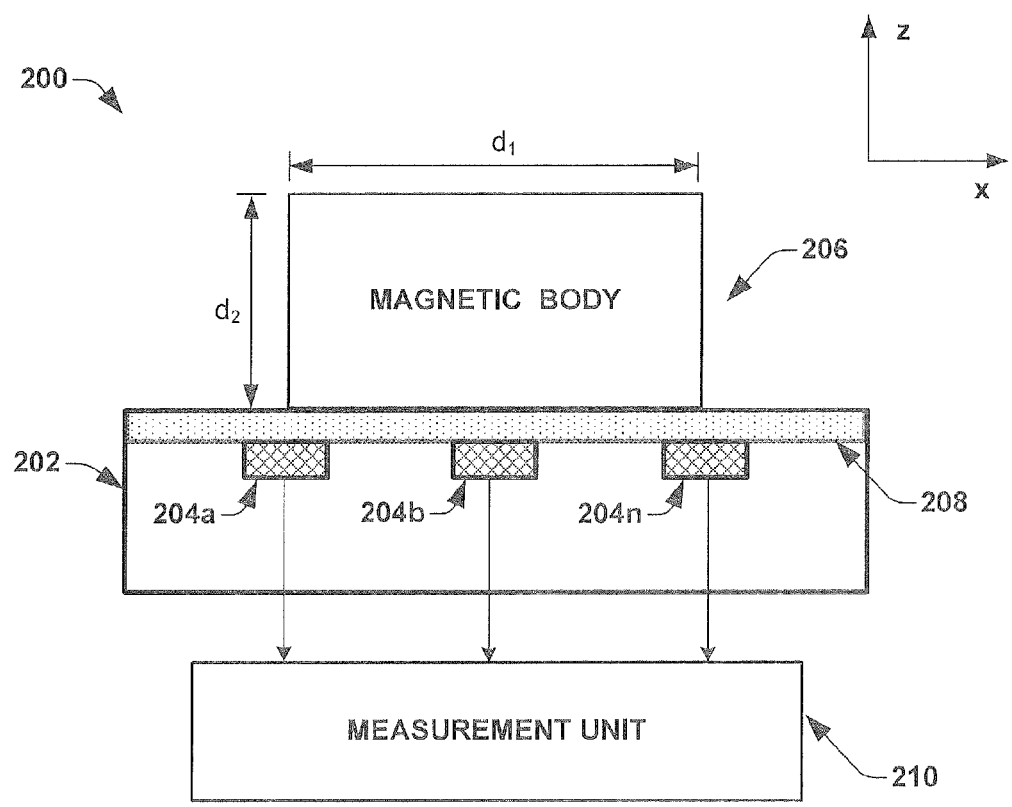
FIG. 2 illustrates a cross sectional view of a first embodiment of a magnetic field sensor comprising a soft-magnetic body attached to the surface of a substrate comprising a plurality of magnetic sensor elements.

FIG. 2 illustrates a cross sectional view of a first embodiment of a magnetic field sensor 200 comprising a squat soft-magnetic body 206 attached directly or via interstitial structures or layers to the surface of a substrate 202, which comprises a plurality of magnetic sensor elements 204. It will be appreciated that the term substrate, as referred to herein, may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith. Furthermore, the term "soft-magnetic body" is broadly meant to encompass materials that distorts a magnetic field (i.e., that have a relative permeability different from 1) rather than independently giving rise to a magnetic field (e.g., as a "hard-magnetic body" comprising a permanent magnetic does). For example, a soft-magnetic body may comprise materials having a large relative permeability such as ferromagnetic or ferrimagnetic materials (e.g., iron with $\mu r=4000$, or MuMetal with $\mu r=10000$).

Referring to FIG. 2, a plurality of spatially diverse magnetic sensor elements $204x$ (wherein x=a, b, . . . n) are comprised at predetermined positions/locations within and/or upon the substrate 202. The plurality of magnetic sensor elements 204 may comprise several magnetic field sensor devices of the same type arranged in proximity to the soft-magnetic body 206. For example, in one embodiment, the plurality of magnetic sensor elements 204 may comprise a plurality of vertical Hall effect devices or magneto-resistive (XMR) sensors configured in an array structure located below the soft-magnetic body 206, for example. In a more particular embodiment, the plurality of magnetic sensor elements 204 may comprise a plurality of Hall plates configured in an array structure to detect magnetic field components along a z-axis that is normal to the "top" surface of the substrate 202.

The soft-magnetic body 206 is configured on the surface of the substrate 202 in proximity to the plurality of magnetic sensor elements 204. The soft-magnetic body 206 may comprise any squat soft-magnetic body having a first dimension $d_1$ parallel to the top surface of the substrate 202 and a second dimension $d_2$ perpendicular to the top surface of the substrate 202. In one embodiment, the squat soft-magnetic body may comprise an aspect ratio between the first and second dimensions ($d_1:d_2$) of less than or equal to 3:1 (e.g., $d_1:d_2=1\frac{1}{2}:1$), where the aspect ratio is the ratio of one in-plane dimension over one out-of-plane dimension (e.g., y-dimension:z-dimension and x-dimension:z-dimension). Additionally, the squat soft-magnetic body may comprise an aspect ratio between the first and second dimensions ($d_1:d_2$) of greater than or equal to 1:3 (e.g., $\frac{1}{3}<d_1/d_2<3$). Therefore, the aspect ratio defines a squat soft-magnetic body that is neither a thin film on the surface of the die (e.g., has an aspect ratio less than 3:1) or a slim structure perpendicular to the surface of the die (e.g., has an aspect ratio greater than 1:3).

In one specific embodiment, the soft-magnetic body 206 may have first and second dimensions, $d_1$ and $d_2$, that are substantially equal (e.g., $d_1 \approx d_2$). Such a symmetry between in-plane and out-of-plane dimensions distorts the in-plane component of the magnetic field the same as the out-of-plane component of the magnetic field resulting in accurate magnetic field measurements for both components.

A gap layer 208 may be configured between the soft-magnetic body 206 and one or more of the plurality of magnetic sensor elements 204 and/or substrate 202. In various embodiments, the gap layer 208 may comprise one or more metal layers and/or intermetal oxide layers plus polyimide and/or other protective layers. In one embodiment, the gap layer 208 may be made of a non-magnetic materials with high dimensional stability: therefore organic coating materials are suboptimal.

In the presence of an external magnetic field (not shown in FIG. 2), the soft-magnetic body 206 becomes magnetized causing it to generate a reactionary magnetic field that together with the external magnetic field form an inhomogeneous superimposed magnetic field having a value equal to a superposition of the external magnetic field and the reactionary magnetic field. See, supra FIG. 3. The plurality of magnetic sensor elements 204 are coupled to a measurement unit 210 configured to receive measurements of a single magnetic field component (e.g., a z-component) of the superimposed magnetic field from the plurality of spatially diverse magnetic sensor elements 204a, 204b, 204n, resulting in a plurality of spatially diverse superimposed magnetic field component measurements. The plurality of spatially diverse superimposed magnetic field component measurements may be processed by the measurement unit 210 to compute magnetic field components of the external magnetic field along a plurality of axes (e.g., x-axis, y-axis, and z-axis).

Therefore, the magnetic field sensor 200 allows for an applied magnetic field having an out-of-plane angle to be accurately measured (e.g., along a plurality of axes) by a single type of magnetic field sensor device.

As used herein, the term "aspect ratio" refers to an aspect ratio for a number of dimensions that are being used by a magnetic field sensor. For example, in an application wherein the plurality of magnetic sensor elements comprise a 2-dimensional sensor array (e.g., corresponding to the 3-d magnetic field sensor shown in FIG. 6 configured to detect magnetic field components in an x, y, and z direction), the aspect ratio in a Cartesian coordinate system would refer to the ratio of: the y-dimension of the soft-magnetic body:the z-dimension of the soft-magnetic body and the x-dimension of the soft-magnetic body:the z-dimension of the soft-magnetic body. In another example, wherein the plurality of magnetic sensor elements comprise sensors aligned along a single direction configured to detect magnetic field components in an in plane and an out of plane direction (e.g., corresponding to the speed sensor of FIGS. 13a-13b), the aspect ratio in a Cartesian coordinate system would refer to the ratio of: the y-dimension of the soft-magnetic body:the z-dimension of the soft-magnetic body or the x-dimension of the soft-magnetic body:the z-dimension of the soft-magnetic body.

The soft-magnetic body may comprise a variety of different shapes that provide an acceptable aspect ratio. In one embodiment, the soft-magnetic body may comprise a spherical shape. In yet another embodiment, the soft-magnetic body may comprise a cylindrical shape. In additional embodiments, the soft-magnetic body may comprise shapes including but not limited to: cubic shapes, elliptical shapes, rectangular prisms, etc.

Such squat shapes of the soft-magnetic body provides for a substantially equal demagnetization factors along orthogonal axes (e.g., along an in-plane axis and along an out-of-plane axis orthogonal to the in-plane axis). Therefore, in the presence of an external magnetic field, when the soft-magnetic body becomes magnetized to generate a reactionary magnetic field, the influence of the demagnetization factors is substantially equal in different directions so as to not amplify the magnetic field in one direction (e.g., along the in-plane axis) a larger amount than in another direction (e.g., along the orthogonal out-of-plane axis).

Furthermore, since the reactionary magnetic field is a strong function of the shape of the soft-magnetic body (e.g., the squat shape of the soft-magnetic body) and a weak function of the relative permeability of the soft magnetic body, the influence of relative permeability on measurements of the superimposed magnetic field in different directions (e.g., in the x, y, and z direction) is reduced (e.g., effectively cancelled out) so as not to influence in-plane field components or out-of-plane field components. In various embodiments, the dimensions of the soft-magnetic body can reduce the influence of the permeability can be suppressed down to 0.1%.

Figure 3A:
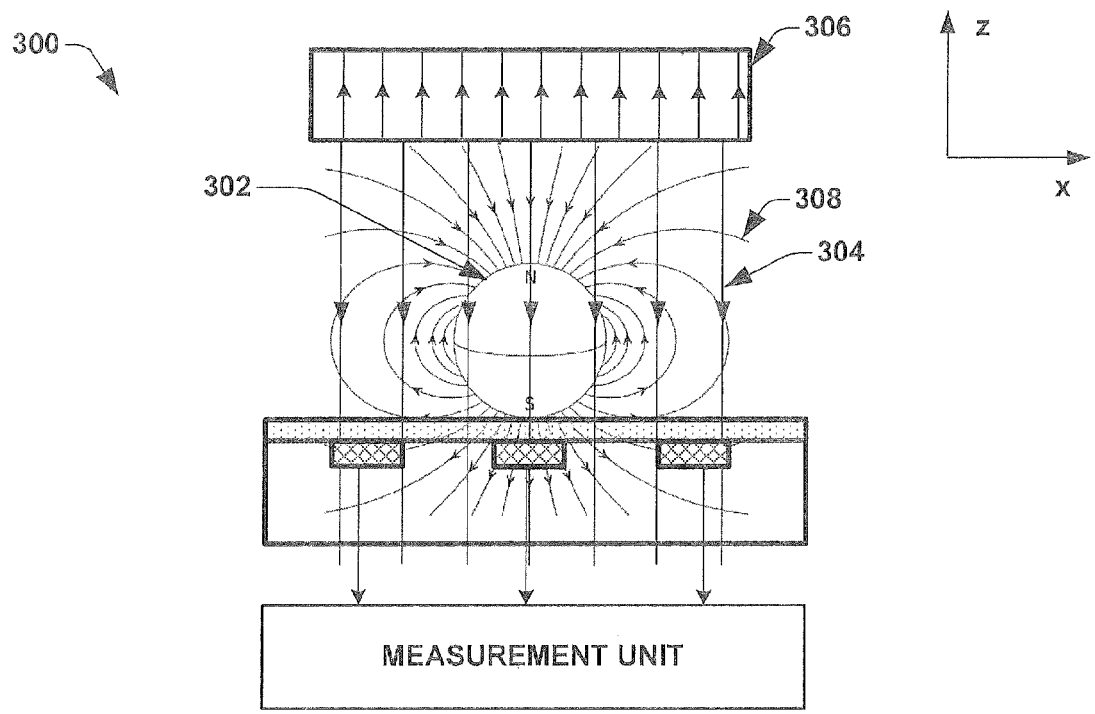
FIG. 3a shows magnetic field lines corresponding to a magnetic field sensor comprising a spherical soft-magnetic body in the presence of an external magnetic field generated by a magnetic field source.

FIG. 3a shows a magnetic field sensor comprising a spherical soft-magnetic body 302 in the presence of an external magnetic field 304 generated by a magnetic field source 306 (e.g., a permanent magnet having an internal magnetization having an orientation as illustrated as B-field lines). It will be appreciated that although FIGS. 3a-3b show magnetic field lines described in relation to a spherical soft-magnetic body that the underlying principles described in relation to FIGS. 3a-3b may be applied to any squat body as defined herein.

In the presence of an external magnetic field 304 (e.g., having an external magnetic field illustrated as H-field lines) the soft-magnetic body 302 becomes magnetized, causing the soft-magnetic body 302 to generate a reactionary magnetic field 308 that varies as a function of position. In particular, as the external magnetic field 304 aligns magnetic dipoles within the soft-magnetic body 302, magnetic "poles" are formed at the ends of the magnetized soft-magnetic body 302 by an internal demagnetization field that is opposite to the magnetization. The generated magnetic poles result in the reactionary magnetic field 308. As shown in FIG. 3a the soft-magnetic body 302 comprises a north magnetic pole (N) and south magnetic pole (S) that are aligned with the external magnetic field 304.

Figure 3B:
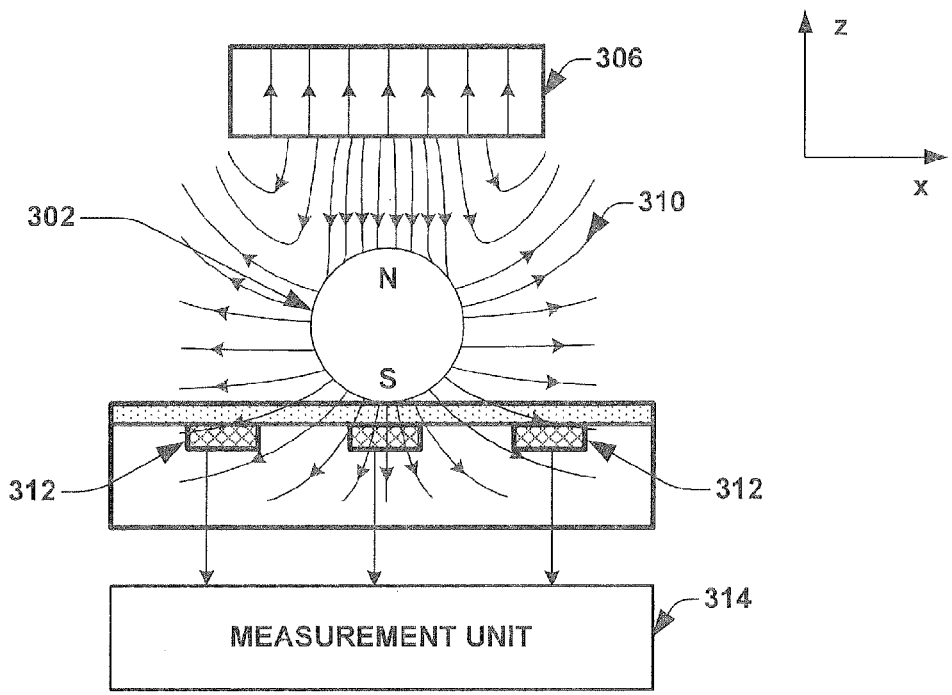
FIG. 3b shows magnetic field lines corresponding to a superposition of an applied magnetic field and a reactionary magnetic field generated by a spherical soft-magnetic body.

The external magnetic field 304 and the reactionary magnetic field 308 collectively form a superimposed magnetic field 310 that is incident upon the plurality of magnetic sensor elements 312, as shown in FIG. 3b. In contrast to the external magnetic field 304, which has uniform magnetic field components at each magnetic sensor element due to the uniformity of the external magnetic field, the superimposed magnetic field 310 is inhomogeneous such that the z-component of the superimposed magnetic field varies as a function of the position of the magnetic sensor elements 312 relative to the soft-magnetic body 302. Since the location of the magnetic sensor elements 312 are known, the different z-components measured at each magnetic sensor elements 312 can be processed by a measurement unit 314 to determine magnetic field components of the applied magnetic field 304 along a plurality of axes (e.g., an x-component along an x-axis, a y-component along a y-axis, and a z-component along a z-axis).

Therefore, as shown in FIG. 3a the soft-magnetic body 302 generates a reactionary magnetic field 308 that modifies the external magnetic field 304 in a manner that causes respective magnetic sensor elements 312 to measure a superimposed magnetic field having different z-components at the spatially diverse magnetic sensor elements 312.

Figure 4:
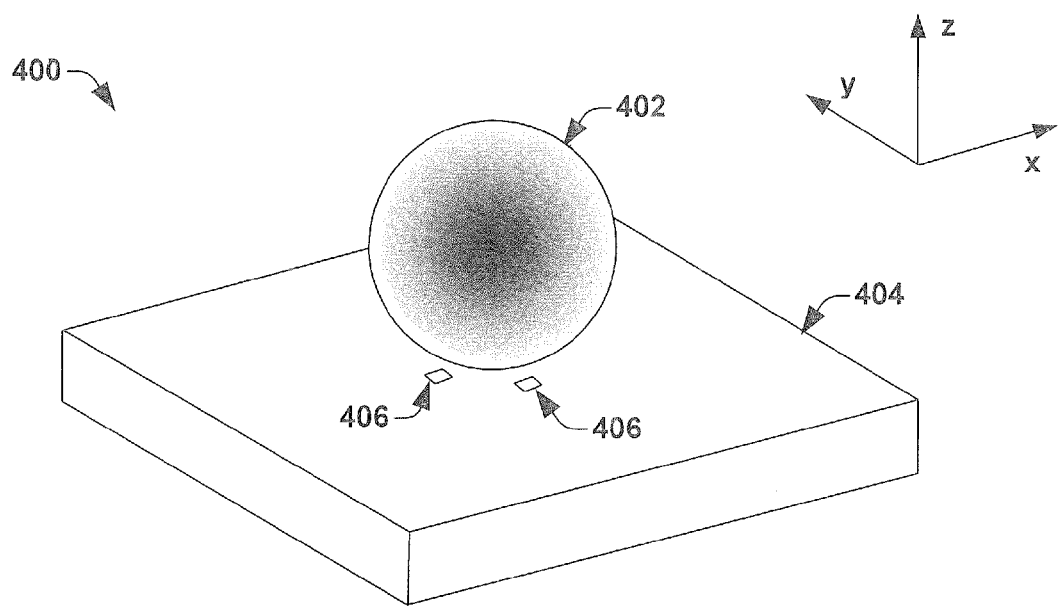
FIG. 4 illustrates a three dimensional view of a magnetic field sensor comprising a spherical shaped soft-magnetic body.

FIG. 4 illustrates a three dimensional view of a magnetic field sensor 400 comprising a spherical shaped soft-magnetic body 402 attached to a semiconductor die 404 having a plurality of magnetic sensor elements 406. The symmetry of a spherical shaped soft-magnetic body 402 causes the magnetic field component along the x, y, and z axes to be amplified by similar factors, as described above. Also, the spherical symmetry of the spherical shaped soft-magnetic body allows for the magnetization inside the sphere to be isotropic (e.g., have no tendency to align along one preferable direction). Therefore, the magnetization can turn in any direction with no preference (e.g., as opposed to a rectangular block in which the magnetization wants to align along the longest side), thereby improving the performance of the magnetic field sensor.

The spherical shape of the soft-magnetic body also provides for simplified placement of the spherical soft-magnetic body 402 onto the semiconductor die 404 due to the symmetry of the spherical shaped soft-magnetic body 402. For example, the spherical shaped soft-magnetic body 402 does not experience problems with tilts and misalignments. Instead, placement of the spherical shaped soft-magnetic body 402 only requires placement at a proper (x, y)-coordinate on top of the semiconductor die 404.

In one embodiment the size of the spherical soft-magnetic body 402 can be made relatively large (e.g., greater than 1 mm in diameter). The large size of the spherical shaped soft-magnetic body 402 reduces the relative effect of placement errors. Furthermore, since the effect of the soft-magnetic body on the applied magnetic field gets larger if the size of the gap layer is small compared to the radius of the sphere, a large size of the spherical shaped soft-magnetic body 402 can also improve magnetic field sensor performance. For example, the size of the spherical soft-magnetic body can be made relatively large (e.g., greater than 1 mm diameter) compared to the size of the gap (which is determined by a technology). However, practical considerations limit the size of the sphere. The inventor has appreciated that the effect of the soft-magnetic body on the applied magnetic field decreases slightly above 1 mm. Therefore, in one embodiment, the magnetic sphere may have a size of 1 mm to 2 mm in diameter.

It will be appreciated that although placement and size of a squat soft-magnetic body is described in relation to a spherical soft-magnetic body in FIG. 4, that the embodiments provided therein apply to other shaped squat magnetic bodies as well. For example, making the size of any shaped squat soft-magnetic body large reduces the relative effect of placement errors.

Furthermore, although the magnetic sensor elements 406 of FIG. 4 are illustrated as a 3-dimensional symmetric sensor array, this is a non-limiting embodiment. One of ordinary skill in the art will appreciate that magnetic sensor elements 406 may be comprised within a sensor array extending along a single axis and/or be comprised within a sensor array having no symmetry. For example, in one embodiment a sensor array may comprise three elements aligned along a single direction to measure magnetic field components in two directions (e.g., an in-plane direction parallel to the line in which the three sensor elements are aligned and an out-of-plane direction perpendicular to the surface of the substrate), while in another embodiment a sensor array may comprise three elements aligned along a two-dimensional scalene triangle configuration.

Figure 5:
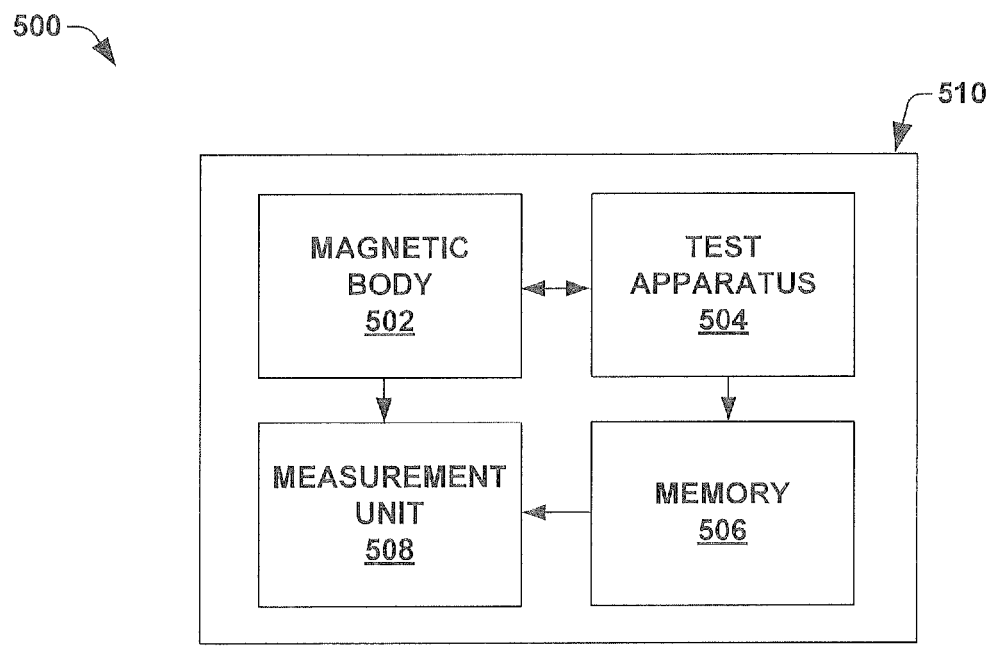
FIG. 5 illustrates a block diagram of a calibration system configured to reduce placement tolerances of a soft-magnetic body on a substrate.

In one embodiment, placement errors can be reduced by using magnetic sensor elements comprised within sensor arrays having a high degree of symmetry. In an alternative embodiment a large portion of placement tolerances can be treated by the system. For example, FIG. 5 illustrates a block diagram of a calibration system 500 that can be used to reduce placement tolerances of a soft-magnetic body 502 on a semiconductor die 510. The calibration system 500 is configured to perform calibration of the magnetic field sensor after attachment of a soft-magnetic body 502 (e.g., a spherical soft-magnetic body) onto the semiconductor die 510. During this calibration a test apparatus 504 is configured to apply a sequence of magnetic test fields with well defined directions to the magnetic field sensor. Suitable correction coefficients are computed from measurements of the magnetic test fields and are stored in a memory 506, which may be located on the semiconductor die 510. During measurement of the magnetic field components, the measurement unit 508 may access the correction coefficients and apply them to measurement of the applied magnetic field components.

Although the components of FIG. 5 are illustrated and described as being on a single semiconductor die, it will be appreciated that in alternative embodiments the components (e.g., 502, 504, 506, and 506) may be located on more than one semiconductor die.

Figure 6:
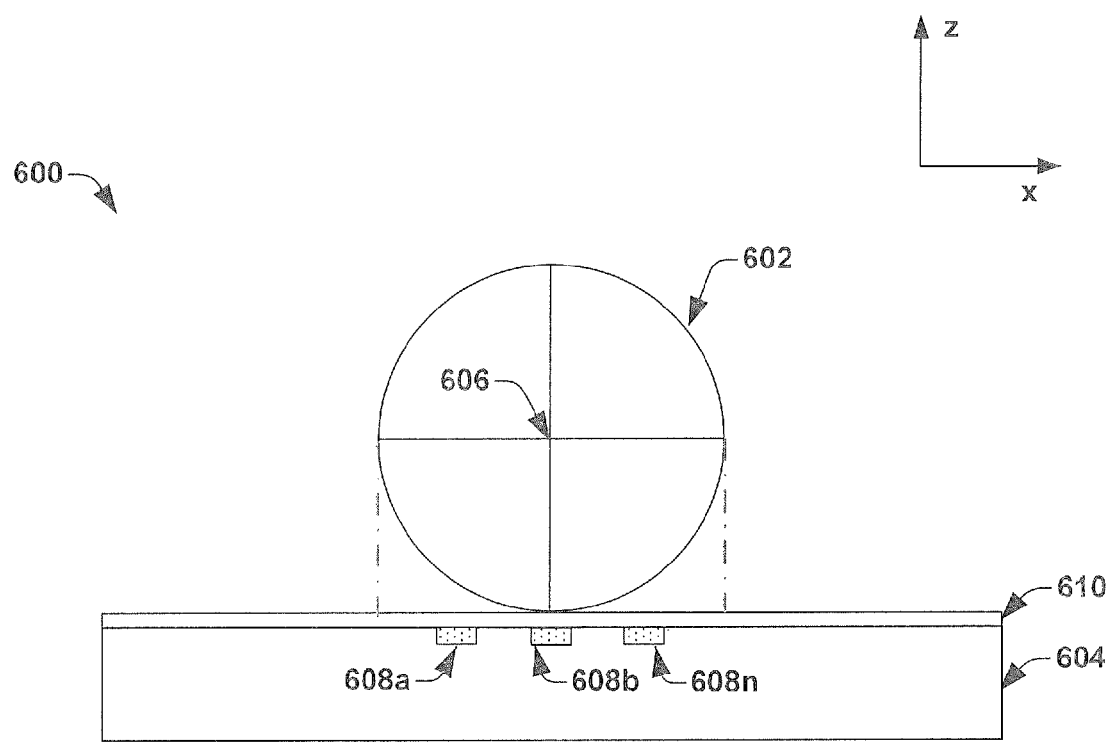
FIG. 6 illustrates a side profile of a magnetic field sensor comprising a spherical soft-magnetic body attached to a semiconductor die.

FIG. 6 illustrates a side profile of a magnetic field sensor 600 comprising a spherical soft-magnetic body 602 attached to a semiconductor die 604. In FIG. 6, magnetic sensor elements 608 are disposed below the spherical soft-magnetic body 602 in a manner such that the magnetic sensor elements 608 fall within the projection of the spherical soft-magnetic body 602 onto the semiconductor die 604 (e.g., the magnetic sensor elements 608 are separated by a distance smaller than the radius of the spherical soft-magnetic body 602). The center 606 of the spherical soft-magnetic body is disposed symmetrically with respect to the peripheral magnetic sensor elements 608a and 608n (e.g., the distance between the center 606 of the spherical soft-magnetic body and the two "outer" magnetic sensor elements 608a and 608n is equal). Furthermore, a gap layer 610 (e.g., comprising several metal and intermetal-oxide layers and a protective poly-imide layer) is illustrated between the spherical soft-magnetic body 602 and the magnetic sensor elements 608.

Figure 7:
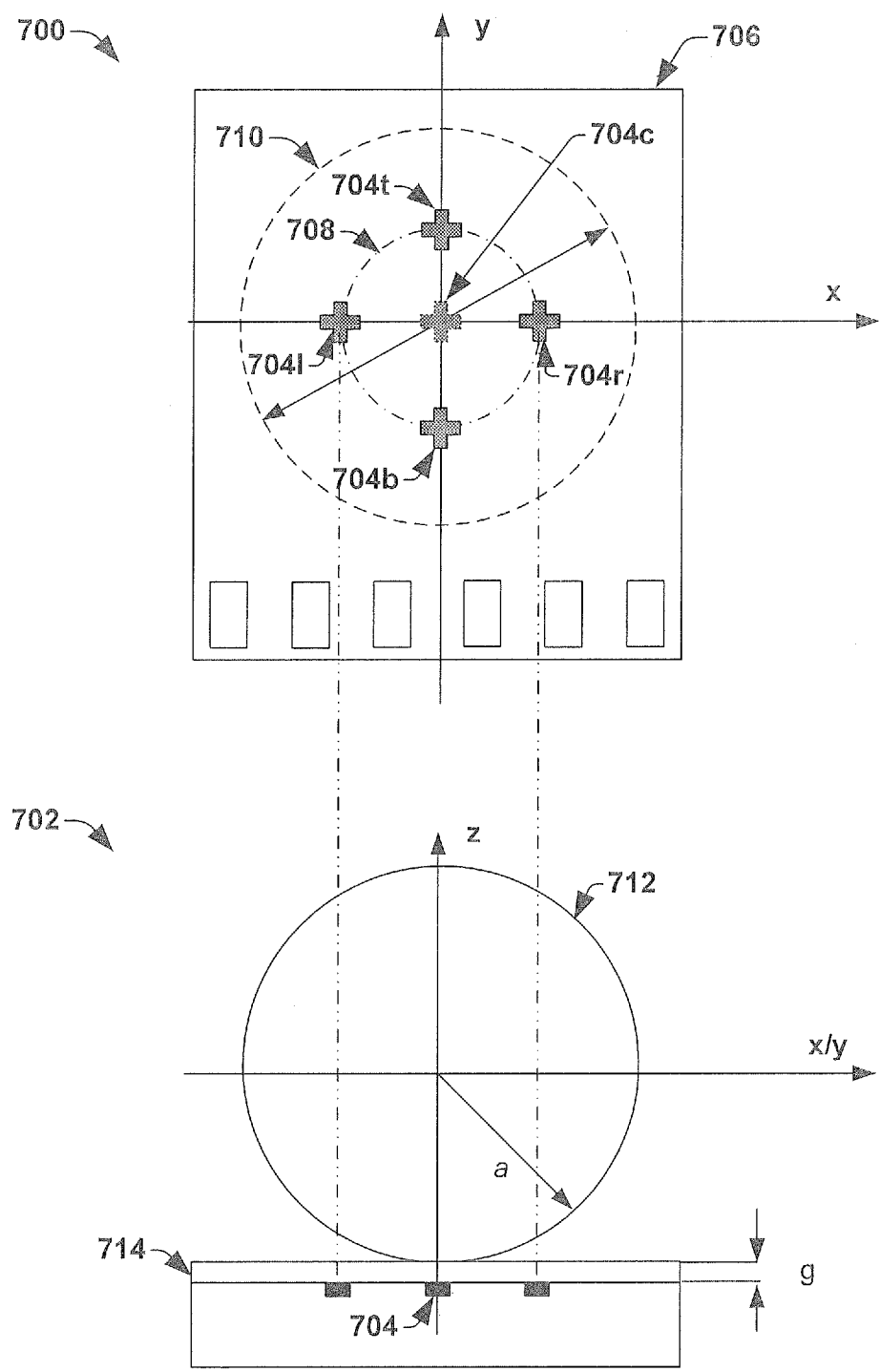
FIG. 7 illustrates a more particular embodiment of a magnetic field sensor having a spherical soft-magnetic body shown from a top view and a cross sectional side profile.

FIG. 7 illustrates a more particular embodiment of a magnetic field sensor having a spherical soft-magnetic body. In particular, FIG. 7 illustrates a top view 700 of a magnetic field sensor and a cross sectional side profile 702 of the magnetic field sensor.

As shown in the top view 700, magnetic sensor elements 704 are disposed on a semiconductor die 706 along a circular pattern 708 concentric with the projection of the spherical body 710 onto the semiconductor die 706. More particularly, FIG. 7 illustrates a sensor array comprising five magnetic sensor elements (704l, 704r, 704t, 704b, 704c) symmetrically disposed along the x-axis and the y-axis, such that the "outside" magnetic sensor elements have a 90° symmetry along the circular pattern 708 below a spherical soft-magnetic body 712. In an alternative embodiment, magnetic sensor element 704c, located directly below the center of the spherical soft-magnetic body 712, may be removed.

Although FIG. 7 illustrates a 2-dimensional sensor array comprising five magnetic sensor elements, in general, any number of magnetic sensor elements may be used in a magnetic field sensor as provided herein. For example, in one embodiment three magnetic sensor elements may be positioned at 120° symmetry along the circular pattern 708. In alternative embodiments the "outside" magnetic sensor elements may comprise a larger or smaller number of magnetic sensor elements. The use of any higher number of magnetic sensor elements to detect the magnetic field pattern across the semiconductor die would result in an improved measurement accuracy (e.g., by least square error fits or other regression schemes) and robustness of the system (e.g., to eliminate inhomogeneous applied fields and filter out the homogeneous part). Furthermore, although symmetry of the magnetic sensor elements may improve magnetic field readings, it is not required. In one embodiment, magnetic sensor elements may be positioned on the semiconductor die without symmetry. For example, three magnetic sensor elements may be configured in a non-symmetric pattern to measure magnetic field components along orthogonal axes (as long as the three elements are not on a single straight line).

Figure 8A:
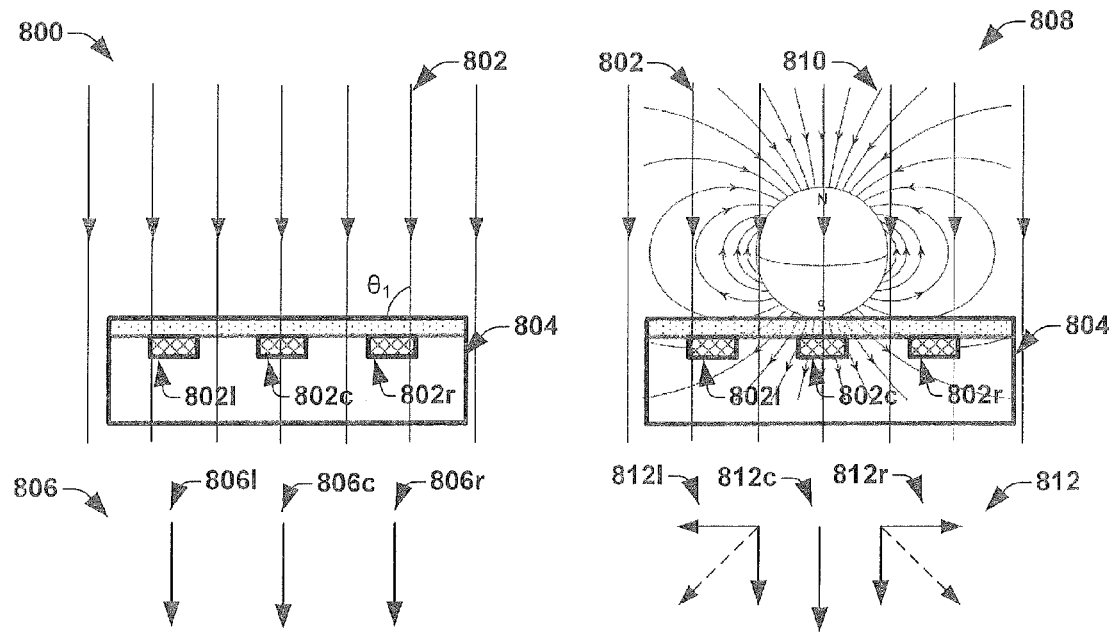
FIGS. 8a-8b illustrate magnetic field line diagrams of a magnetic field sensor comprising a spherical soft-magnetic body and associated vector diagrams.
Figure 8B:
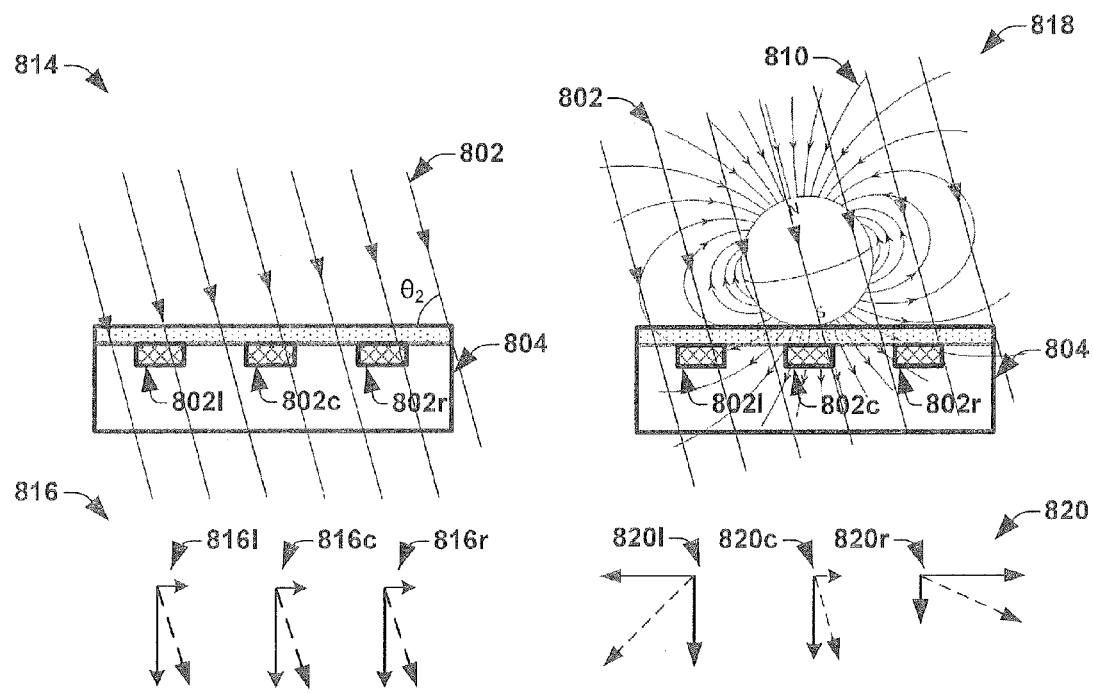

As stated above, a plurality of magnetic sensor elements are configured to measure a magnetic field value of a superposition of an external magnetic field and a reactionary magnetic field along a single direction. Magnetic field components along a plurality of orthogonal axes can be computed based upon the measured magnetic field value of the superposition of the external magnetic field and the reactionary magnetic field. FIGS. 8a-8b illustrate magnetic field line diagrams of a magnetic field sensor comprising a spherical soft-magnetic body, and associated vector diagrams. In particular, the vector diagrams graphically illustrate how the z-component of the superimposed magnetic field changes at various magnetic sensor element positions based upon the out-of-plane angle θ of the applied magnetic field.

FIG. 8a illustrates a magnetic field sensor 804 in the presence of an applied magnetic field 802 aligned with the z-axis (i.e., that has an out-of-plane angle $\theta_1=90°$). As shown in diagram 800, when the magnetic field sensor 804 is in the presence of an applied external magnetic field 802, but there is no soft-magnetic body, each sensor element 802x (where x=l, c, r) measures an equal magnetic field component in the z-direction, as shown by vector diagrams 806x (where x=l, c, r). However, as shown in diagram 808, when the magnetic field sensor 804 comprises a soft-magnetic body that is magnetized by the applied external magnetic field 802 to generate a reactionary magnetic field 810, the superposition of the applied external magnetic field and the reactionary magnetic field causes the z-component of a superimposed magnetic field to change as a function of position. Therefore, different magnetic sensor elements (e.g., 802l, 802c, or 802r) may measure different magnetic field components in the z-direction as shown by vector diagrams 812. In particular, the z-component of the superimposed magnetic field measured at the central magnetic sensor element 802c (e.g., located at a position where the applied magnetic field and the reactionary magnetic field are in the same direction) measures a larger z-component of the magnetic field than the peripheral magnetic sensor elements 802l and 802r (e.g., located at positions where the applied magnetic field and the reactionary magnetic field are in different directions). For example, vector diagram 812c has a larger z-component than vector diagrams 812r and 812l.

FIG. 8b illustrates the magnetic field sensor 804 in the presence an applied magnetic field that is rotated with respect to the z-axis (i.e., that has an out-of-plane angle of $\theta_2<\theta_1$). As shown in diagram 814, when the magnetic field sensor 804 is in the presence of the applied external magnetic field 802, but there is no soft-magnetic body, each sensor element 802x (where x=l, c, r) measures an equal magnetic field component in the z-direction, as shown by vector diagrams 816x (where x=l, c, r). However, as shown in diagram 818, when the magnetic field sensor 804 comprises a soft-magnetic body that is magnetized to generate a reactionary magnetic field 810, the superposition of the applied and reactionary magnetic field cause the z-component of the superimposed magnetic field to change as a function of position so that different sensor elements (e.g., 802l, 802c, 802r) may measure different magnetic field components in the z-direction.

In particular, in the presence of an applied magnetic field 802 the soft-magnetic body generates a north magnetic pole (N) and a south magnetic pole (S) that are aligned with the applied magnetic field 802. The magnetic poles generate a reactionary magnetic field 810 that is added to the applied magnetic field 802 to form the superimposed magnetic field. In contrast to FIG. 8a, rotation of the applied magnetic field 810 with respect to the z-axis causes the measured z-components of the superimposed magnetic field to be not symmetric around the central magnetic sensor element 802c. For example, the right magnetic sensor element 802r will measure a smaller z-component (illustrated by vector diagram 820r) than the left magnetic sensor element 802l (illustrated by vector diagram 820l) since the rotation of the reactionary magnetic field 810 causes the superimposed magnetic field at the position of the right magnetic sensor element 802r to have a smaller z-component than the superimposed magnetic field at the position of the left magnetic sensor element 802l. Similarly, the central magnetic sensor element 802c will measure a different z-component than that measured in diagram 808 (illustrated by vector diagram 820c compared to vector diagram 812c).

Processing the measured magnetic field z-components, shown in FIGS. 8a-8b, allows for the plurality of magnetic sensor elements 802 to be used to determine an out-of-plane angle θ, computed from the known position of the magnetic sensor elements and the spatially diversity of the magnetic field measurements.

Figure 9:
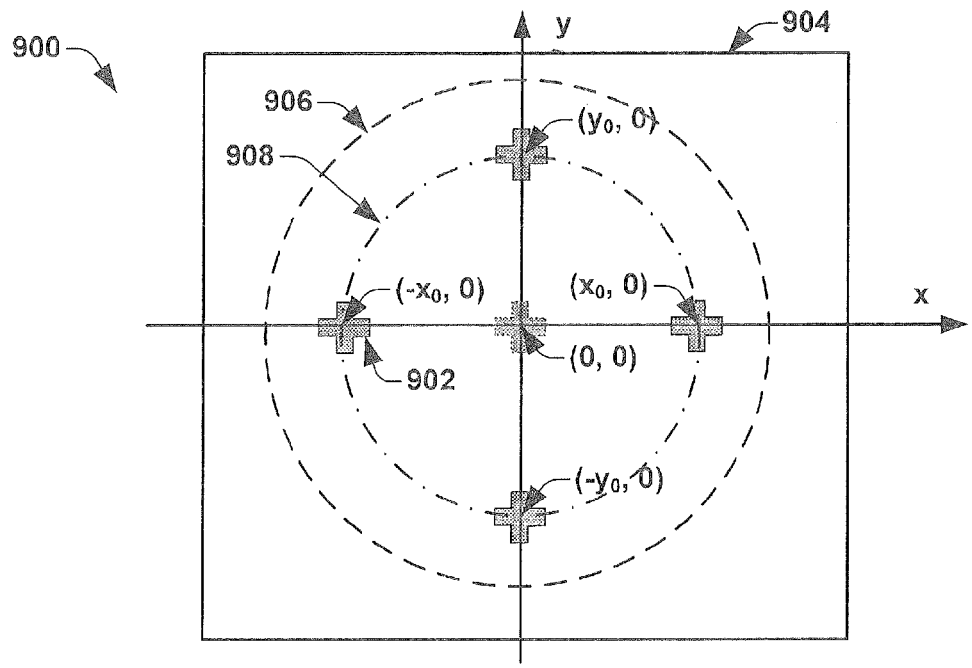
FIG. 9 illustrates a Cartesian coordinate system applied to a magnetic field sensor comprising a spherical soft-magnetic body.

FIG. 9 illustrates a Cartesian coordinate system applied to a magnetic field sensor 900 comprising a spherical soft-magnetic body. As illustrated in FIG. 9, the magnetic field sensor 900 comprises magnetic sensor elements 902 symmetric around an origin (0, 0) of a Cartesian coordinate reference frame. Analogous to the vector diagrams shown in FIGS. 8a-8b, different components of the magnetic field (e.g., the x, y, and z components) can be determined by processing of the magnetic field measurements taken in the z-direction (going out of the plane of the paper) at different spatial locations on the semiconductor die 904.

For example, the x-component of the applied magnetic field ($h_x$) is proportional to the difference between z-components of a superimposed magnetic field ($B_z$ fields) at a position of ($x_0$, 0) and at a position of ($-x_0$, 0). Analogously, the y-component of the applied magnetic field ($h_y$) is proportional to the difference between $B_z$ fields at a position of (0, $y_0$) and at a position of (0, $-y_0$). The z-component of the applied magnetic field ($h_z$) can be computed in various ways: by adding the two $B_z$ fields at a position of ($x_0$, 0) and at a position of ($-x_0$, 0) to obtain $h_z^x$, by adding the two $B_z$ fields at a position of (0, $y_0$) and at a position of (0, $-y_0$) to obtain $h_z^y$, or by alternatively placing a sensor at (0,0) (i.e. right below the spherical body) and directly measuring the z-components of a superimposed magnetic field there to obtain $h_z^z$. In additional embodiments, the measured superimposed magnetic field components can be added (e.g., $h_z^x+h_z^y$ or $h_z^x+h_z^y+h_z^z$) to give better results in the presence of: mismatch of magnetic sensor elements, placement tolerances of the soft-magnetic body, noise of magnetic sensor elements, inhomogeneous mechanical stress and temperature on the magnetic sensor elements.

In one embodiment, if the magnetic sensor elements 902 are configured to respond to a vertical magnetic field (i.e., a magnetic field aligned with the z-axis going out of the plane of the paper) they can be spaced apart by a distance which optimizes the effect of the reactionary magnetic field on the magnetic sensor elements. In one embodiment, wherein the magnetic sensor elements are positioned along a circular pattern 908, magnetic sensor elements along a given axis (e.g., x-axis, y-axis) and on the circular pattern 908 may be optimized by spacing them apart from each other by a distance equal to the radius of a spherical soft-magnetic body plus the height of the gap layer. For example, in FIG. 9 magnetic sensor elements located at ($x_0$, 0) and ($-x_0$, 0) can be optimized by spacing them apart from each other by a distance of a+g (where a is the radius of the sphere and g is the vertical dimension of the gap layer as shown in the cross sectional side profile 702 of FIG. 7), such that $2x_0$=a+g. Similarly, magnetic sensor elements located at (0, $y_0$) and (0, $-y_0$) can be optimized by spacing them apart from each other by a distance of a+g, such that $2y_0$=a+g. Such spacing optimizes the effect of the reactionary magnetic field, generated by the magnetic spherical body, on the magnetic sensor elements 902.

Figure 10:
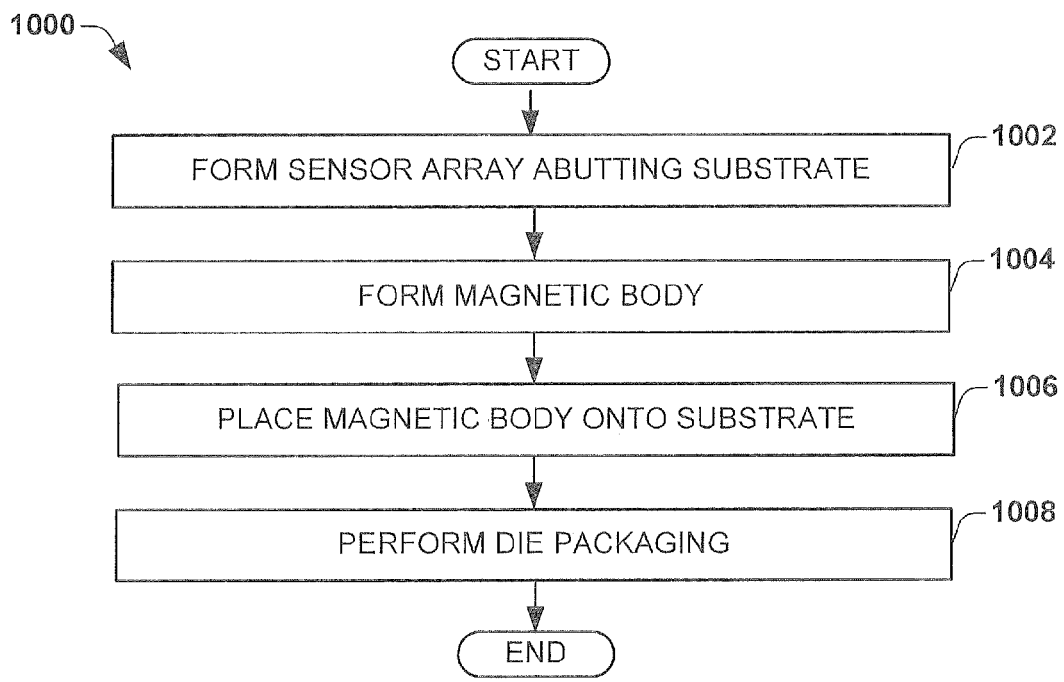
FIG. 10 illustrates an exemplary method for fabricating a magnetic field sensor as provided herein.

FIG. 10 illustrates an exemplary method 1000 for fabricating a magnetic field sensor as provided herein. FIGS. 11-12 illustrate various embodiments of magnetic field sensors as provided herein. Although FIGS. 11-12 will be described in conjunction with exemplary method 1000 it will be appreciated that the figures are not-limited to structures formed by the method, but instead comprise distinct physical apparatuses that are independent of the method of fabrication.

At 1002 a sensor array comprising a plurality of magnetic sensor elements is formed to abut a substrate. In one embodiment, the sensor array may be formed within the substrate. In an alternative embodiment, the sensor array may be formed on top of the substrate. The sensor array comprises a plurality of magnetic sensor elements having a single type of magnetic field sensor devices. For example, in one embodiment the magnetic sensor elements comprise devices that respond to the z-component of a magnetic field, but not to the x or y components of the magnetic field. The magnetic sensor elements may generally comprise accurate and linear sensor elements that may be integratable in a CMOS process.

Figure 11A:
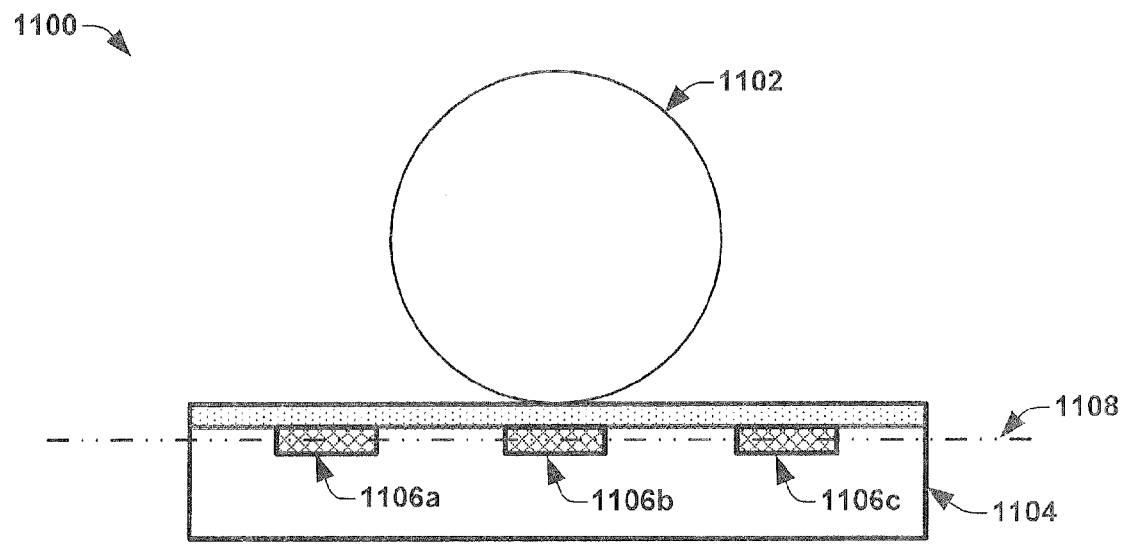
FIG. 11a illustrates a magnetic field sensor comprising a plurality of magnetic sensor elements that are substantially co-planar.
Figure 11B:
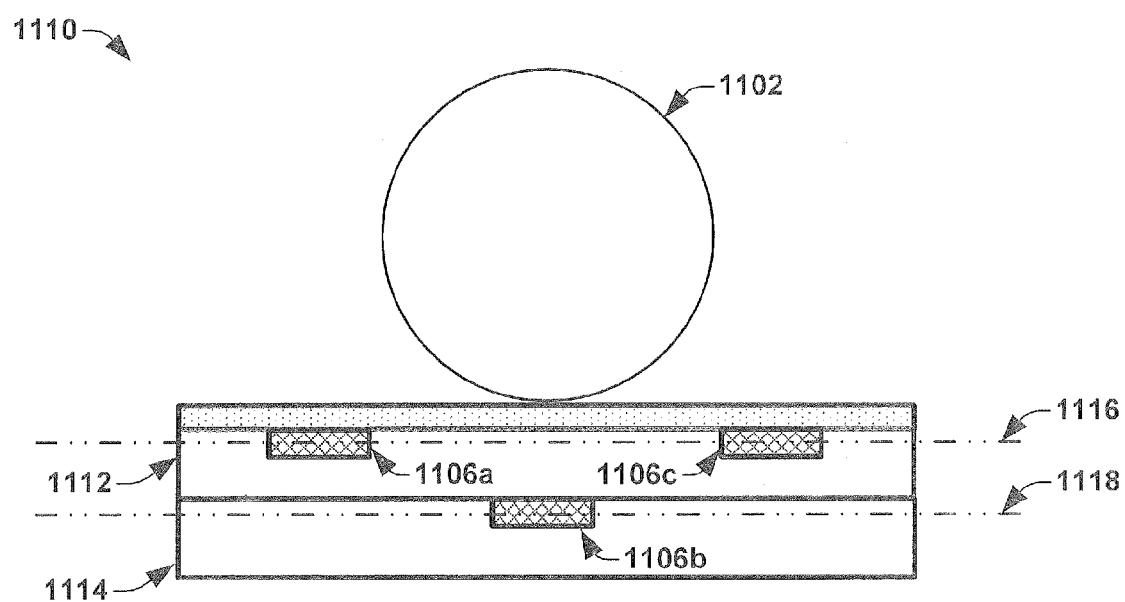
FIG. 11b illustrates a magnetic field sensor comprising a plurality of magnetic sensor elements that are not co-planar.

In one embodiment, shown in FIG. 11a, a magnetic field sensor 1100 is configured to comprise a plurality of magnetic sensor elements 1106 that are substantially co-planar along a plane 1108 (e.g., parallel to the x-axis). Such an embodiment may comprise a plurality of magnetic sensor elements configured in a 2-dimensional sensor array that is co-planar along plane 1108 within a substrate 1104. In an alternative embodiment, shown in FIG. 11b, a magnetic field sensor 1110 is configured to comprise a plurality of magnetic sensor elements 1106 that are located along more than one plane. In particular, FIG. 11b shows a magnetic field sensor 1110 comprising a stacked die arrangement in which a first semiconductor die 1112 is stacked upon another second semiconductor die 1114 so as to form magnetic sensor elements 1106 in a plurality of planes. For example, as shown in FIG. 11b magnetic sensor elements 1106a and 1106c are formed along a first plane 1116 formed within the first semiconductor die 1112 and magnetic sensor element 1106b is formed along a second separate plane 1118 formed within the second semiconductor die 1114 that is placed on top of the first semiconductor die 1112 during fabrication of the magnetic field sensor 1110. The configuration shown in FIG. 11b, having a central magnetic sensor element 1106c in the lower second semiconductor die 1114 may be advantageous so that soft-magnetic body 1102 does not press on the central magnetic sensor element 1106c.

At 1004 a soft-magnetic body is formed. The soft-magnetic body may comprise a soft magnetic material with low coercivity and large relative permeability. In one embodiment, the soft-magnetic body may comprise a large saturation magnetization. In more particular embodiments, the soft-magnetic body may comprise soft magnetic ferrites and nickel-iron alloys like permalloy or mu-metal, for example.

In one embodiment the soft-magnetic body may be compatible to a package assembly process or to front-end semiconductor manufacturing processes. Furthermore, the soft-magnetic body may be chemically inert in combination with soldering or glued processes, which might be used to attach the spherical body to the surface of the die. In one embodiment, the soft-magnetic body may be resistive to corrosion and moisture ingress through the plastic encapsulation of typical cheap sensor packages. In another embodiment, the soft-magnetic body is comprised of a material that is able to stand the temperature ranges used during fabrication and operation of the magnetic field sensor. In one particular embodiment, the soft-magnetic body is first ground and afterwards annealed by suitable thermal treatment (typically done in H2-atmosphere) to reduce the coercivity. In an embodiment wherein the soft-magnetic body comprises a spherical body, well-known production techniques from manufacturers of ball bearings can be used to manufacture the soft-magnetic body with a high accuracy and low cost.

At 1006 the soft-magnetic body is placed onto a substrate. If the soft-magnetic body is large enough, small placement tolerances are not relevant. Moreover, a calibration can be performed to remove the placement tolerances as described above. See, supra FIG. 5.

Figure 12A:
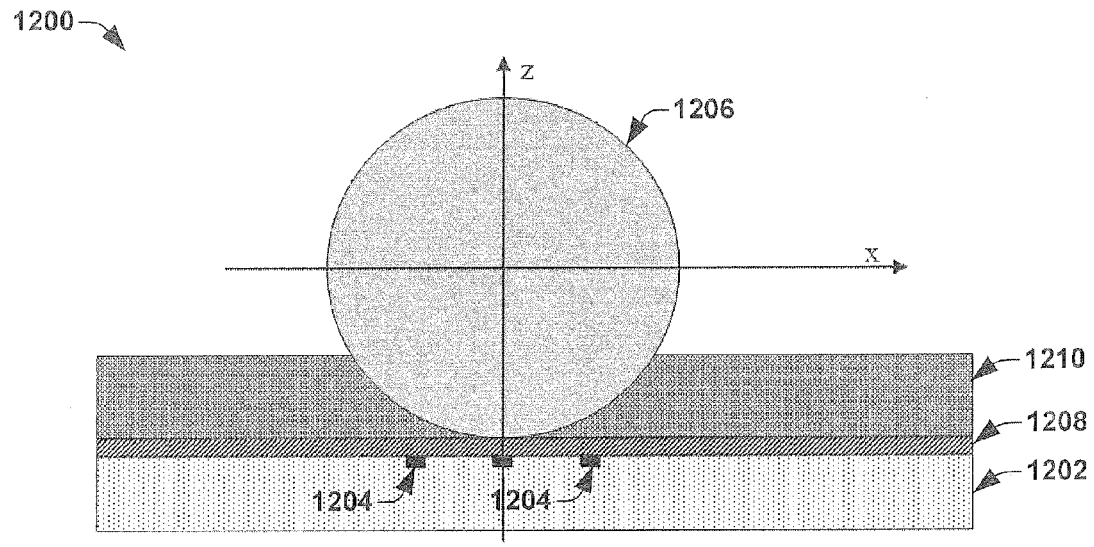
FIG. 12a illustrates one embodiment of a magnetic field sensor attached to the "top" of a semiconductor die comprising a glass wafer.
Figure 12B:
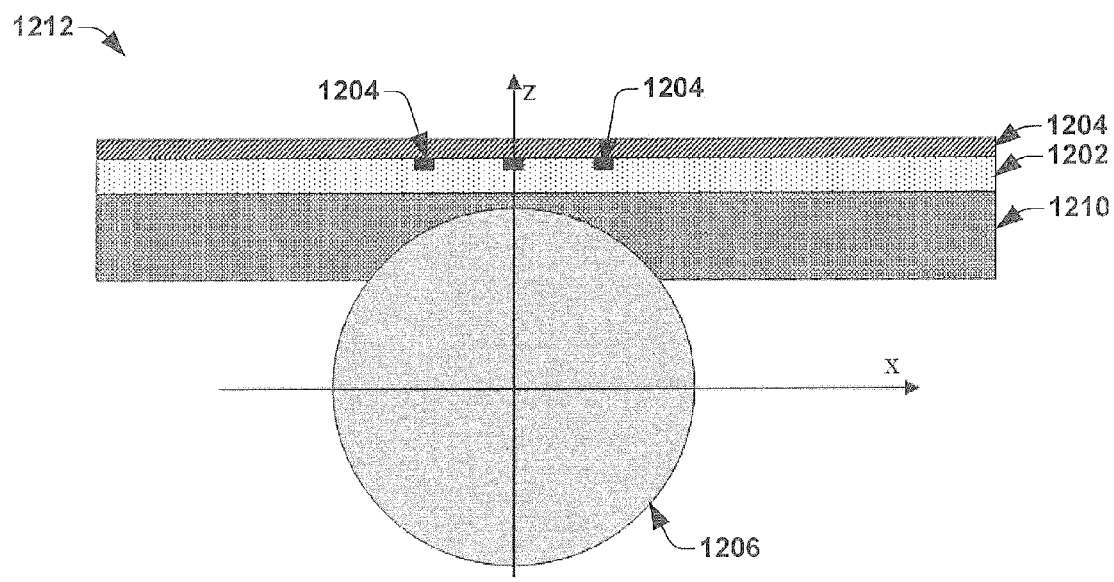
FIG. 12b illustrates an alternative embodiment of a magnetic field sensor attached to the "bottom" of a semiconductor die comprising a glass wafer.

In alternative embodiments, shown in FIGS. 12a-12b the magnetic field sensor may use a "glass layer" or glass wafer 1210 to aid in placement of the soft-magnetic body 1206. The glass wafer 1210 may be made of a type of glass with similar thermal expansion coefficients to that of a semiconductor die 1202. For example, silicon substrates may use Borofloat glass.

One or more holes and/or recesses can be etched into the glass wafer 1210 (e.g., using an isotropic etching procedure). As shown in FIG. 12a, a hole is configured to extend through the height of the glass wafer, while in FIG. 12b, a recess is not configured to extend through the height of the glass wafer. Furthermore, the holes/recesses may be formed to have different shapes. For example, in one embodiment a hole/recess may conform to a spherical shape of a soft-magnetic body, while in another embodiment the hole/recess may comprise a V-groove formed with anisotropic etching in silicon to accommodate part of a soft-magnetic body.

The glass wafer 1210 can be bonded to the semiconductor die 1202 using either adhesives or an anodic bond procedure, for example. The alignment accuracy of glass wafer 1210 versus silicon wafer can be very high (e.g., better than 5 μm). The glass wafer 1210 may be thinned down to 200-400 μm after bonding to the semiconductor die 1202, using methods well known in the art (e.g., chemical mechanical polishing). Afterwards, the soft-magnetic body 1206 can be placed into the one or more holes/recesses of the glass wafer.

In some embodiments the use of a glass wafer for alignment allows for more than one soft-magnetic body to be attached per die at well defined positions in the holes/recesses of a glass wafer bonded to a semiconductor wafer. In one embodiment, soft-magnetic bodies attached to a die may even have different sizes that can be adjusted by the holes/recesses in the glass wafer. In one embodiment, a three-dimensional patterning may be used during wafer manufacturing to aid in placement of one or more soft-magnetic bodies on a semiconductor die. The three-dimensional patterning can be done using a photo-patterning processes that uses a SU8 photoresist, for example.

FIG. 12a illustrates a first embodiment of a magnetic field sensor 1200, wherein a glass wafer 1210 placed on "top" of a semiconductor die 1202 comprising a plurality of magnetic sensor elements 1204. A gap layer 1208 is configured between the semiconductor die 1202 and the glass wafer 1210. FIG. 12b, illustrates an alternative embodiment of a magnetic field sensor 1212, wherein the glass wafer 1210 and the spherical soft-magnetic body are placed on the "bottom" surface of the semiconductor die 1202 (i.e., the surface that is more distant to the magnetic sensor elements 1204). The alternative embodiment of the magnetic field sensor 1212 may advantageously bring the sensor elements 1204 in close proximity to some external structure. In such an embodiment, the semiconductor die 1202 may be made as thin as possible (e.g. 60 μm thick) in order to minimize the vertical distance between sensor elements 1204 and soft-magnetic body 1206.

At 1008 the die packaging is performed. The die packaging may comprise encapsulating the semiconductor die (comprising the magnetic field sensor) in a plastic encapsulation. In one embodiment, to prevent stress on a soft-magnetic body, the soft-magnetic body may be stored in a liquid emulsion that may also prevent oxidation or corrosion of the surfaces that might give rise to delamination between the surface of the sphere and the mould compound.

Figure 13A:
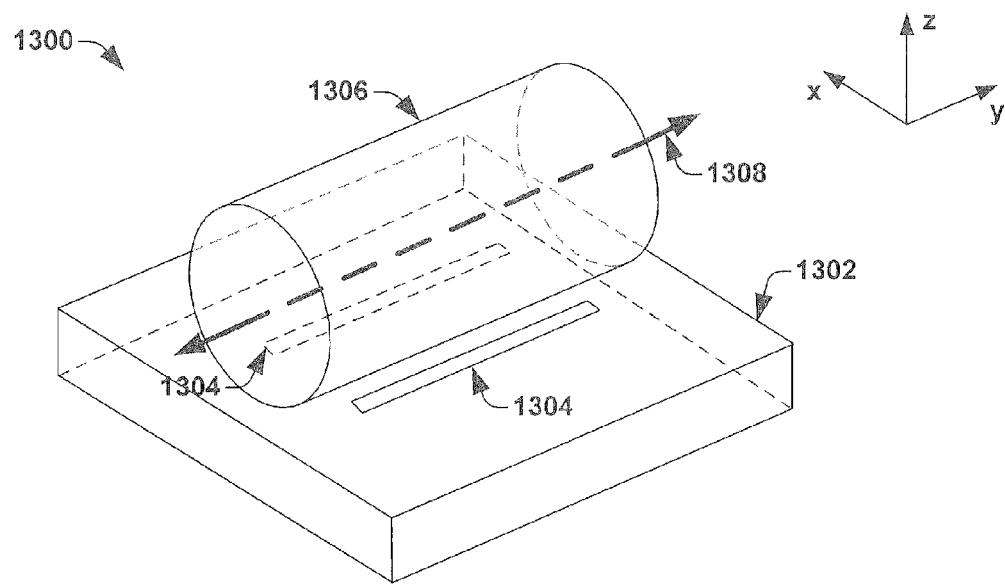
FIGS. 13a-13b illustrate an additional embodiment of a magnetic field sensor comprising a cylindrically shaped soft-magnetic body which makes use of magneto-resistive (XMR) sensors for a speed detection sensor system.
Figure 13B:
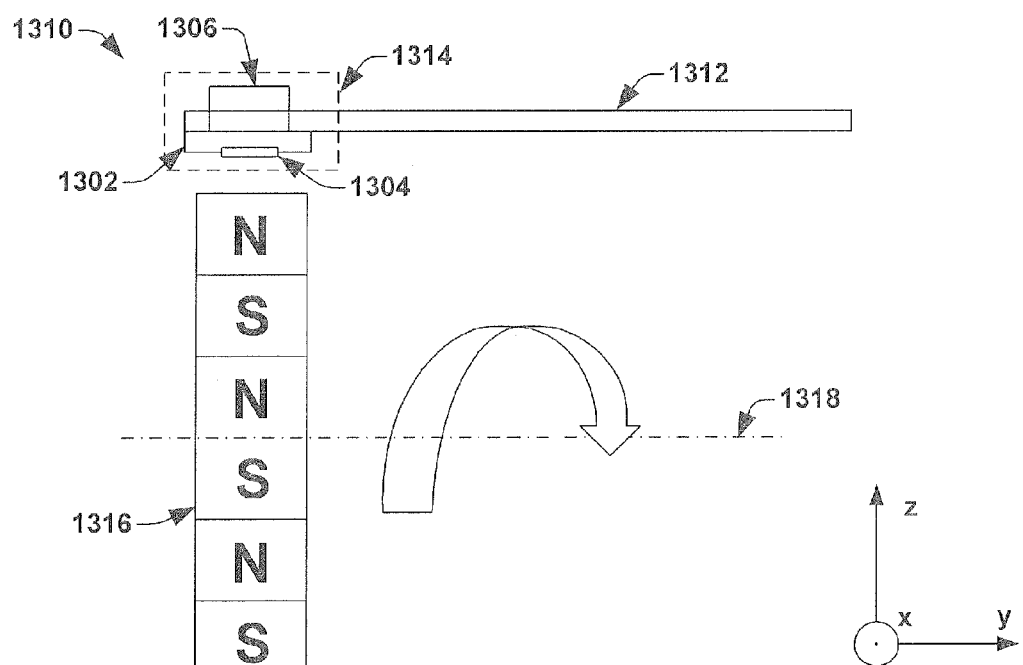

FIG. 13a-13b illustrate an additional embodiment of a magnetic field sensor comprising a cylindrically shaped soft-magnetic body which makes use of magneto-resistive (XMR) sensors (e.g., giant magneto-resistive (GMR) sensor elements) for a speed detection sensor system. The magnetic field sensors are configured to compute the vertical field component out of the horizontal field component of XMR signals.

FIG. 13a illustrates a three dimensional diagram of a magnetic field sensor 1300 comprising a semiconductor die 1302 having two long XMR-sensor strips 1304 arranged laterally (e.g., to the left and right) around a cylindrically shaped soft-magnetic body 1306 attached to the surface of the semiconductor die 1302. The cylindrically shaped soft-magnetic body 1306 is aligned with the XMR sensor strips 1304 so as to have its axis of symmetry 1308 mid-way between the XMR sensor strips 1304. In one embodiment, the cylindrically shaped soft-magnetic body 1306 is configured the "bottom" side of the semiconductor die 1302 to minimize the distance between the XMR sensors and a pole-strip.

The magnetic field sensor 1300 may be comprised within a leadframe package of a speed detection sensor system 1310, as shown in FIG. 13b. FIG. 13b illustrates a leadframe 1312 coupled to a semiconductor die 1302 having XMR sensor strips 1304 and attached to a cylindrically shaped soft-magnetic body 1306. The magnetic field sensor may be encapsulated in a package 1314 (e.g., a plastic encapsulation) to prevent damage to the magnetic field sensor. The magnetic field sensor is positioned in proximity to a permanently magnetized pole-strip 1316 configured to generate an external magnetic field.

The pole-strip 1316 comprises a sequence of north (N) and south (S) magnetic poles and is configured rotate around an axis of rotation 1318. The sequence of N and S magnetic poles may be lined up along a first path that is perpendicular to the axis of symmetry 1308 of the cylindrically shaped soft-magnetic body 1306. In various embodiments the pole-strip may comprise a straight strip or one having a curvature along a perimeter of a wheel, so that the pole-strip is a sequence of N and S poles lined up in a direction that runs perpendicular to the XMR sensor strips. When rotating, the N and S magnetic poles form an oscillating external magnetic field.

In the presence of the external magnetic field the cylindrically shaped soft-magnetic body 1306 diverts the z-component of the magnetic field generated by the pole-strip into an x-direction (i.e., the cylinder bends the z-components of magnetic field generated by the pole-strip 1316 into the x-direction). The pole-strip 1316 also generates a magnetic field in the x-direction and in the y-direction that are sinusoidal with a 90° phase shift.

The magnetic field components measured by the XMR sensor stripes 1304 can be added to measure the x-component of the magnetic field generated by the pole-strip. Similarly, the magnetic field components measured by the XMR sensor stripes 1304 can be subtracted to measure the z-component of the magnetic field generated by the pole-strip. Furthermore, because the x and y components of the magnetic field are sinusoidal and 90° out-of-phase they can be used to detect the direction of rotation. Therefore, the magnetic field sensor can measure both the x and z components of the magnetic field as well as the direction of the rotation of the pole-strip (e.g., clock-wise, counter-clock-wise).

In one embodiment, the magnetic field sensor may comprise two the cylindrically shaped magnetic bodies, as is well known to one of ordinary skill in the art. In such an embodiment, the two cylindrically shaped magnetic bodies may be spaced apart from each other certain spacing in x-direction. Then the system can extract the difference of Bx-fields and the difference of Bz-fields generated by the pole-strip at the two locations.

It will be appreciated that the magnetic field sensor 1300 can be used for any size of pole-strip. Moreover, the use of a large cylinder can shunt away the y-component of the magnetic field on the XMR sensors, making them more robust. Furthermore, since the XMR sensors are very sensitive, noise relevant figures of merit (like phase jitter and maximum possible airgap) are improved compared to Hall sensors.

Figure 14:
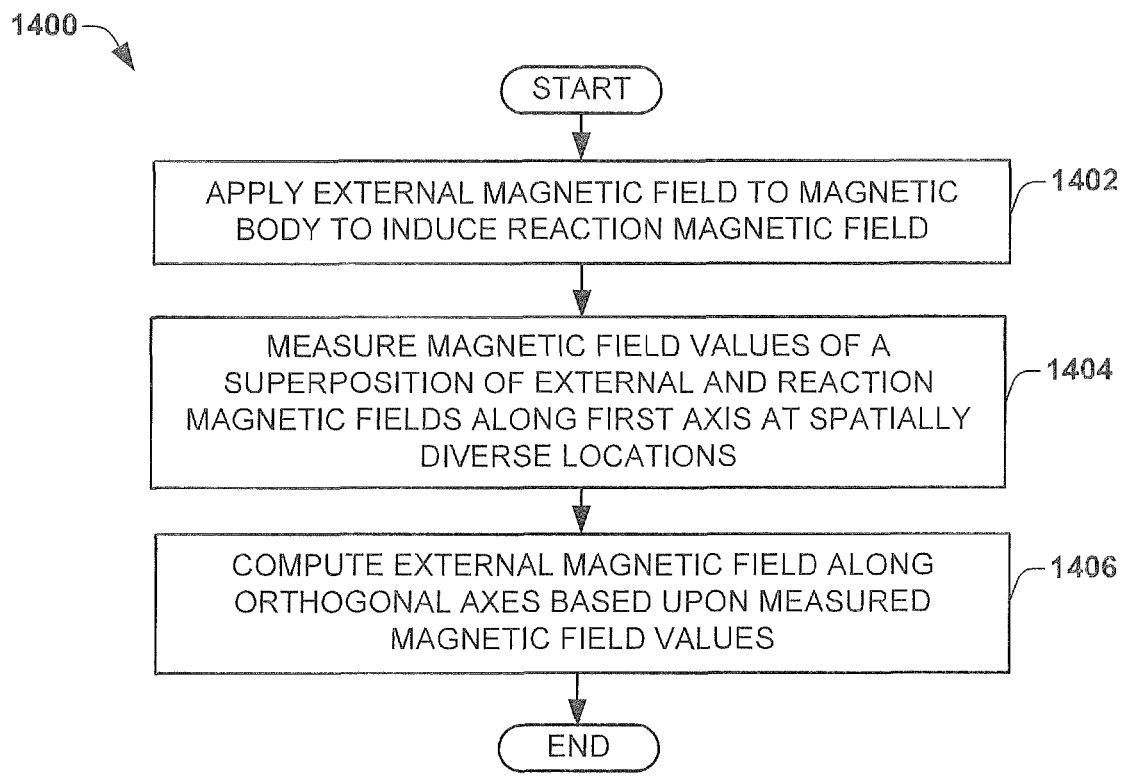
FIG. 14 illustrates a flow diagram of an exemplary method for determining components of a magnetic field having a non-orthogonal out-of-plane angle.

FIG. 14 illustrates a flow diagram of an exemplary method 1400 for measuring components of a magnetic field having a non-orthogonal out-of-plane angle.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 1402 an external magnetic field is applied to a soft-magnetic body to induce a reactionary magnetic field that varies as a function of position. In particular, an external magnetic field is configured to align magnetic dipoles of a soft-magnetic body along an axis that is coincident with the out-of plane angle, resulting in the formation of magnetic "poles" in the soft-magnetic body. The magnetic poles form a reactive magnetic field that is superimposed upon the external magnetic field to form a superimposed magnetic field.

At 1404 values of the superimposed magnetic field along a first direction are measured at spatially diverse locations resulting in a plurality of measured magnetic field values. In one embodiment, a magnetic sensor array having a plurality of spatially diverse magnetic sensor elements disposed in a predetermined configuration on a semiconductor die may be configured to measure values of the superimposed magnetic field at spatially diverse locations on the semiconductor die.

At 1406 a magnetic field along a plurality of axis is computed based upon the plurality of measured magnetic field values. For example, the magnetic field components along an x, y, and z direction may be computed based upon a plurality of measured magnetic field components along the z direction.

Although the invention has been illustrated and described with respect to one or more implementations, alterations and/or modifications may be made to the illustrated examples without departing from the spirit and scope of the appended claims. The claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A magnetic field sensor, comprising:
a plurality of spatially diverse magnetic sensor elements disposed in a predetermined configuration comprised within or on a surface of a substrate, wherein the plurality of magnetic sensor elements are configured to measure a superimposed magnetic field values, of a superposition of an external magnetic field and a reactionary magnetic field, along a first axis;
a squat soft-magnetic body attached directly or via interstitial structures or layers to the substrate, wherein the entire squat soft-magnetic body comprises a spherical shaped soft-magnetic body, and wherein in the presence of the external magnetic field the squat soft-magnetic body is configured to generate the reactionary magnetic field in a manner that causes the superimposed magnetic field to have different magnetic field values along the first axis at the plurality of spatially diverse magnetic sensor elements, which collectively indicate magnetic field components along a plurality of axes; and
a measurement unit configured to compute magnetic field components along the plurality of axes based upon the measured magnetic field values of the superposition of the external magnetic field and the reactionary magnetic field along the first axis.

2. The magnetic field sensor of claim 1, wherein the squat soft-magnetic body comprises substantially equal demagnetization factors along orthogonal in-plane and out-of-plane axes, so as to distort a component of the superimposed magnetic field along the in-plane axis the same amount as a component of the superimposed magnetic field along the out-of-plane axis.

3. The magnetic field sensor of claim 1, wherein the squat soft-magnetic body comprises a first dimension parallel to the substrate and a second dimension perpendicular to the substrate, wherein an aspect ratio between the first and second dimensions is smaller than 3:1 and larger than ⅓:1.

4. The magnetic field sensor of claim 1, further comprising a gap layer located between the plurality of magnetic sensor elements and the squat soft-magnetic body, wherein the gap layer comprises one or more metal layers, intermetal-oxide layers, or a protective poly-imide layer.

5. The magnetic field sensor of claim 4, wherein magnetic sensor elements are disposed along a circular pattern concentric with a projection of the spherical shaped soft-magnetic body onto the substrate.

6. The magnetic field sensor of claim 5, wherein magnetic sensor elements along one or more in-plane axes are spaced apart from each other by a distance equal to the radius of the spherical shaped soft-magnetic body plus a height of the gap layer.

7. The magnetic field sensor of claim 1, wherein the plurality of magnetic sensor elements are configured to detect a magnetic field component along an out-of-plane axis normal to the substrate.

8. The magnetic field sensor of claim 1, wherein the soft-magnetic body comprises an axis of symmetry positioned between two magneto-resistive sensor strips.

9. The magnetic field sensor of claim 8,
wherein the magnetic field sensor is configured in proximity to a pole-strip, the pole-strip comprising a plurality of magnetic north and south poles lined up along a first path.

10. The magnetic field sensor of claim 1, further comprising a glass layer bonded to the substrate, the glass layer comprising at least one hole or recess located in proximity to the magnetic sensor elements, wherein the soft-magnetic body is comprised at least partly within the hole.

11. The magnetic field sensor of claim 10, wherein the glass layer is bonded to a first surface of the substrate that is opposite a second side of the substrate abutting the plurality of magnetic sensor elements.

12. The magnetic field sensor of claim 1,
wherein a calibration system is configured to perform calibration of the magnetic field sensor,
wherein the calibration system comprises:
a test apparatus configured to apply a sequence of magnetic test fields with well defined direction to the magnetic field sensor;
a memory configured to store suitable correction coefficients computed from measurements taken on the magnetic test fields; and
wherein during measurement of the magnetic field components, the measurement unit may access the memory and apply the correction coefficients to measurement of the external magnetic field.

13. A magnetic field sensor, comprising:
a semiconductor die;
a plurality of magnetic sensor elements disposed at predetermined positions within or along a surface of the semiconductor die;
a gap layer abutting the semiconductor die or the plurality of magnetic sensor elements; and
a squat soft-magnetic body abutting the gap layer directly or via interstitial structures or layers, wherein the entire squat soft-magnetic body comprises a spherical shaped soft-magnetic body, and wherein in the presence of an external magnetic field the squat soft-magnetic body is configured to generate a reactionary magnetic field that is superimposed on the external magnetic field to generate an inhomogeneous superimposed magnetic field having magnetic field components perpendicular to the surface of the semiconductor die with values that change in a different manner at respective magnetic sensor elements as a function of an orientation of the external magnetic field.

14. The magnetic field sensor of claim 13,
wherein the plurality of magnetic sensor elements are disposed on the semiconductor die at positions that are symmetric with respect to an apex of the spherical shaped soft-magnetic body.

15. The magnetic field sensor of claim 13, wherein the squat soft-magnetic body comprises a first dimension parallel to the semiconductor die and a second dimension perpendicular to the semiconductor die, wherein an aspect ratio between the first and second dimensions is smaller than 3:1 and larger than ⅓:1, so that the soft-magnetic body distorts an in-plane component of the superimposed magnetic field substantially the same as an out-of-plane component of the superimposed magnetic field.

16. The magnetic field sensor of claim 13, wherein the predetermined positions of the plurality of magnetic sensor elements comprise a symmetry about an origin of a reference frame aligned with a center of the squat soft-magnetic body.

17. A method for detecting a magnetic field, comprising:
applying an external magnetic field to a squat soft-magnetic body to induce a reactionary magnetic field, wherein the entire squat soft-magnetic body comprises a spherical shaped soft-magnetic body;
measuring magnetic field values of a superposition of the external magnetic field and the reactionary magnetic field along a first axis at a plurality of spatially diverse locations within or along a substrate; and
computing magnetic field components along a plurality of orthogonal axes based upon the measured magnetic field values of the superposition of the external magnetic field and the reactionary magnetic field.

18. The method of claim 17, wherein the plurality of spatially diverse locations are symmetric about an origin of a reference frame aligned with a center of the squat soft-magnetic body.

19. The method of claim 17, wherein the squat soft-magnetic body is configured to generate different magnetic field values along a first axis at a plurality of spatially diverse magnetic sensor elements, which collectively indicate magnetic field components along a plurality of axes.

* * * * *